(12) United States Patent
Ting et al.

(10) Patent No.: US 9,087,577 B2
(45) Date of Patent: Jul. 21, 2015

(54) HYBRID MEMORY

(71) Applicant: Taiwan Semiconductor Manufacturing Company, Ltd., Hsin-Chu (TW)

(72) Inventors: Yu-Wei Ting, Taipei (TW); Chun-Yang Tsai, New Taipei (TW); Kuo-Ching Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 224 days.

(21) Appl. No.: 13/725,733

(22) Filed: Dec. 21, 2012

(65) Prior Publication Data
US 2014/0177318 A1    Jun. 26, 2014

(51) Int. Cl.
*G11C 13/00* (2006.01)
*G11C 14/00* (2006.01)

(52) U.S. Cl.
CPC .......... *G11C 13/004* (2013.01); *G11C 13/0002* (2013.01); *G11C 13/003* (2013.01); *G11C 13/0007* (2013.01); *G11C 13/0033* (2013.01); *G11C 13/0069* (2013.01); *G11C 14/00* (2013.01); *G11C 14/0045* (2013.01); *G11C 2213/74* (2013.01)

(58) Field of Classification Search
CPC ............. G11C 13/004; G11C 13/0002; G11C 13/0069; G11C 13/0033
USPC ......................................... 365/148
See application file for complete search history.

(56) References Cited

U.S. PATENT DOCUMENTS

| | | | |
|---|---|---|---|
| 2007/0004162 A1* | 1/2007 | Tang et al. ................... | 438/372 |
| 2009/0059652 A1* | 3/2009 | Taguchi ........................ | 365/148 |
| 2014/0153314 A1* | 6/2014 | Baker et al. .................. | 365/148 |
| 2014/0369108 A1* | 12/2014 | Mohammad et al. ......... | 365/148 |

* cited by examiner

*Primary Examiner* — Han Yang
*Assistant Examiner* — Xiaochun L Chen
(74) *Attorney, Agent, or Firm* — Haynes and Boone, LLP

(57) ABSTRACT

A two-switch hybrid memory cell device includes a storage node connected between one terminal of a first switch and a gate of a second switch. The device also includes a resistive switching device connected to the storage node. The resistive switching device is to act as a capacitance by being set to a high resistive state when the memory cell is in a dynamic mode.

20 Claims, 6 Drawing Sheets

HYBRID MEMORY

BACKGROUND

Computer memory may be either volatile or non-volatile. Volatile memory can operate at relatively high speeds but has to be connected to a power source in order to maintain its data. One type of volatile memory is dynamic memory. Dynamic memory typically uses capacitance to store data. Because the value stored in a capacitance will fade in time, it must be refreshed periodically. In contrast to volatile memory, non-volatile memory is able to maintain its data without a power supply and without being refreshed. Non-volatile memory, however, operates at a relatively slow speed.

Memory systems are often embedded into various systems. For example, mobile devices typically utilize embedded memory that is fabricated into the same integrated circuit as the processor and other mobile device circuitry. Mobile devices are becoming more powerful yet smaller in size. Thus, it is desirable to best utilize available space on each integrated circuit within the mobile device. Moreover, it is desirable to ensure that the mobile device operates efficiently with respect to power consumption.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
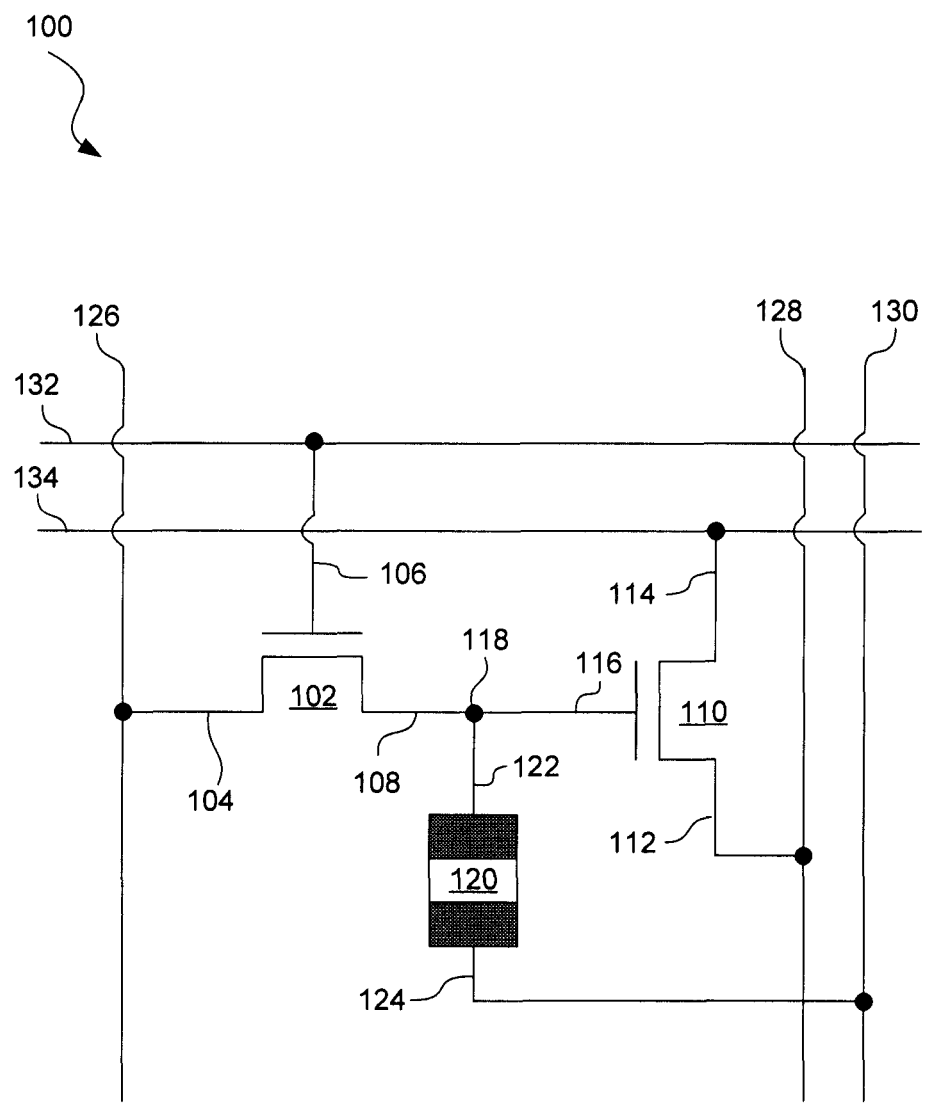
FIG. 1 is a diagram showing an illustrative hybrid memory cell, according to one example of principles described herein.

FIG. 1 is a diagram showing an illustrative two-switch hybrid memory cell 100. According to certain illustrative examples, the memory cell 100 includes a first switch 102 and a second switch 110. For reasons that will be explained further below, the first switch may be referred to as a write switch 102 while the second switch may be referred to as a read switch 110. The memory cell 100 also includes a resistive switching device 120. According to certain illustrative examples, the hybrid memory cell 100 may operate in two modes. In one mode, the memory cell 100 is in a dynamic mode and uses the capacitance of the resistive switching device 120 in a high resistive state to store data and act as a dynamic memory cell. In another mode, which will be referred to as the non-volatile mode, the resistive switching device 120 is used to store data in a non-volatile manner.

While the write switch 102 and the read switch 104 are illustrated as Metal Oxide Semiconductor Field Effect Transistor (MOSFET) devices, it is understood that other types of switches may be used. Particularly, different types of transistors may be used in accordance with principles described herein.

According to certain illustrative examples, a first terminal 104 of the write switch 102 is connected to a write bit line 126. The gate 106 of the write switch is connected to a write word line 132. The second terminal 108 of the write switch 102 is connected to a storage node 118. The operation of the read switch 110 will be described further below with the text accompanying FIG. 2.

According to certain illustrative examples, the gate 116 of the read switch 110 is also connected to the storage node 118. The first terminal 114 of the read switch 110 is connected to a read word line 134. The second terminal 112 of the read switch 110 is connected to a read bit line 128. The operation of the read switch 110 will be described further below with the text accompanying FIG. 3.

Memory arrays are often organized with word lines and bit lines. A word line is connected to several memory cells storing bits within a single word. A word is a fixed number of bits with which a particular instruction set architecture operates. For example, a 64-bit architecture processes words that are 64 bits in length. A bit line is used to select a particular bit within a word. The configuration of bit lines and word lines described herein are merely one embodiment of principles described herein. Other methods for writing and reading data to a hybrid cell in accordance with principles described herein may be used.

The first terminal 122 of the resistive switching device 120 is connected to the storage node 118. The second terminal 124 of the resistive switching device 120 is connected to a select line 130. The resistive switching device 120 may be a metal-insulator-metal device. Such a device exhibits a resistive state that is based on both present and past electrical conditions. For example, a particular voltage applied may set the resistive switching device 120 into a high resistive state. Additionally, a sufficient voltage of opposite polarity may set the resistive switching device into a relatively low resistive state.

According to certain illustrative examples, the metal-insulator-metal resistive switching device may include a dielectric layer between a top electrode and a bottom electrode. The electrodes may be made of a variety of conductive materials such as metals or metal nitrides. The dielectric layer may be made of a one of several metal oxides such as titanium dioxide ($TiO_2$).

Figure 2:
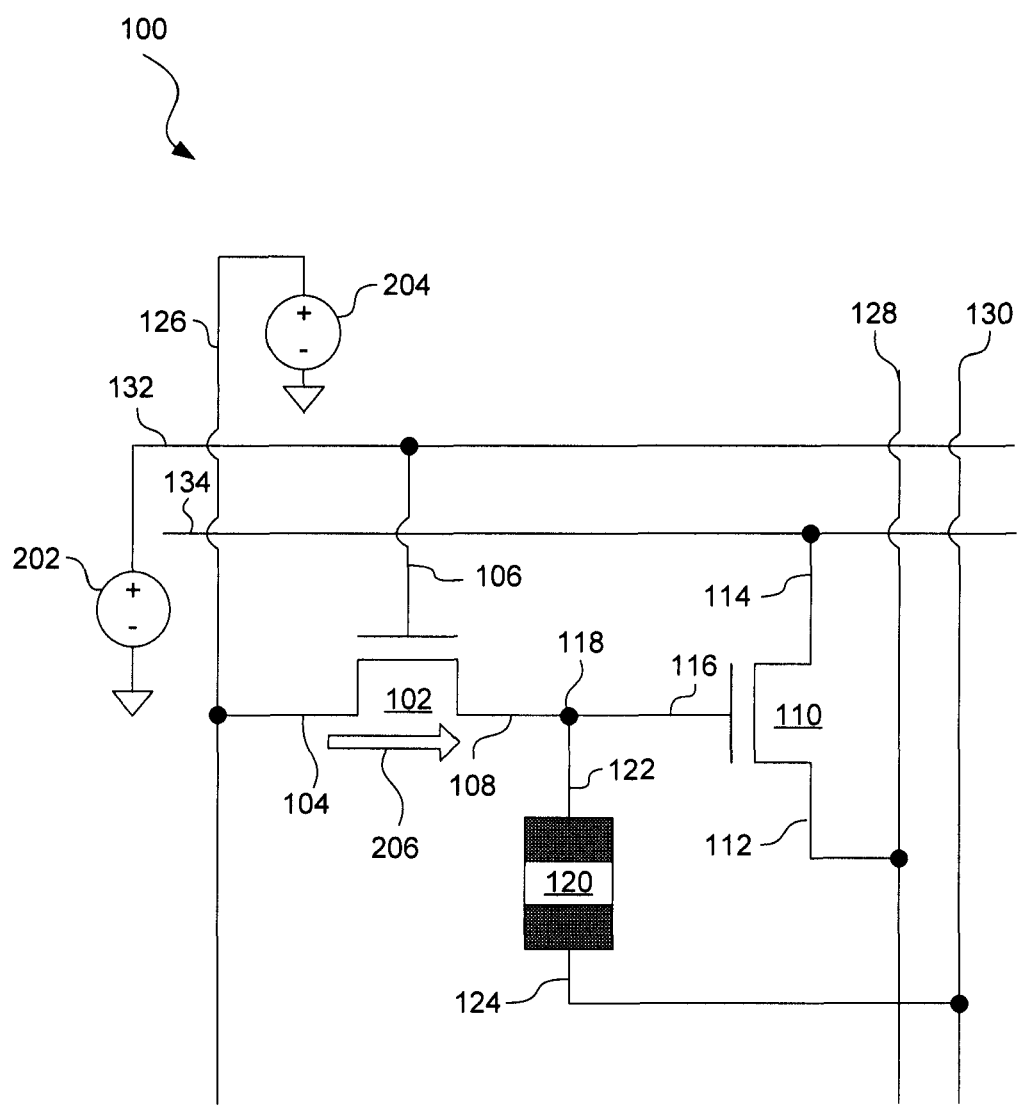
FIG. 2 is a diagram showing an illustrative write operation for a hybrid memory cell in a dynamic mode, according to one example of principles described herein.

FIG. 2 is a diagram showing an illustrative write operation for a hybrid memory cell 100 in a dynamic mode. According to certain illustrative examples, while in dynamic mode, the resistive switching device 120 is in a high resistive state. In this state, there is a capacitance between the two electrodes separated by the dielectric layer of the resistive switching device 120.

To write to the memory cell, a signal 202 is applied to the write word line 132. In one example, the signal may be a voltage pulse of sufficient strength to set the state of the write switch 102 to an ON state. In the ON state, the write switch 102 allows electric current 206 to flow between the first terminal 104 and the second terminal 108. With the application of the signal 202 to the word line, the write switch 102 for each memory cell along that word line will be set to the ON state, allowing each bit in that word to be set.

To set the state of a particular memory cell along the selected word line, a signal 204 is applied to the write bit line 126 connected to that memory cell. Because the write switch 102 is in an ON state, that signal is applied to the storage node 118. In one example, a high signal is used to store a logical '1' and a low signal is used to represent a digital '0'. To set the device to store a '1', the write signal 204 can be a high signal. This signal will be stored as a voltage in the capacitance from the resistive switching device 120. As mentioned above, the voltage stored in a capacitance will fade in time. Thus, the value of the capacitance is refreshed periodically. This refreshing process can consume a relatively high amount of power.

Figure 3:
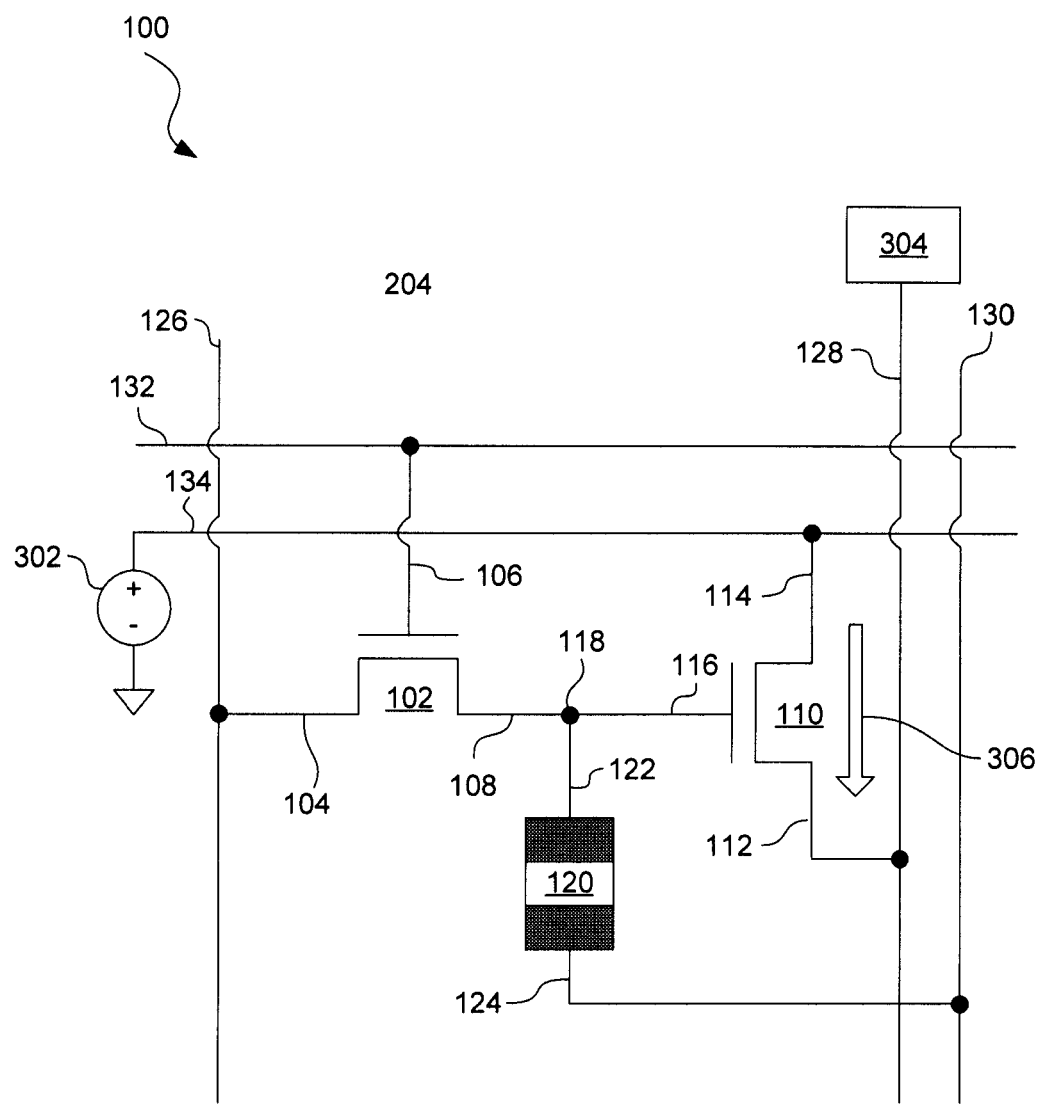
FIG. 3 is a diagram showing an illustrative read operation for a hybrid memory cell in a dynamic mode, according to one example of principles described herein.

FIG. 3 is a diagram showing an illustrative read operation for a hybrid memory cell 100 in a dynamic mode. To read the data stored in the memory cell 100, the read bit line 128 is connected to a sense amplifier 304. Additionally, a read signal 302 is applied to the read word line 134.

If the value stored in the capacitance at the storage node 118 is a high value, then the read switch 110 will be set to an ON state. In the ON state, an electric current 306 can flow between the first terminal 114 and second terminal 112 of the read switch 110. Thus, the read signal 302 applied to the read word line 134 will pass through the read switch 110 and travel through the read bit line 128 to the sense amplifier 304. The memory system can then know that the memory cell 100 is in a high state, representing a logical '1'.

If the value stored in the capacitance at the storage node 118 is a low value representing a logical '0', then the read switch will remain in the OFF state. Thus, the read signal 302 will not travel through the read switch 110 to the sense amplifier 304. The memory system can then know that the memory cell 100 is in a low state, representing a logical '0'.

Figure 4:
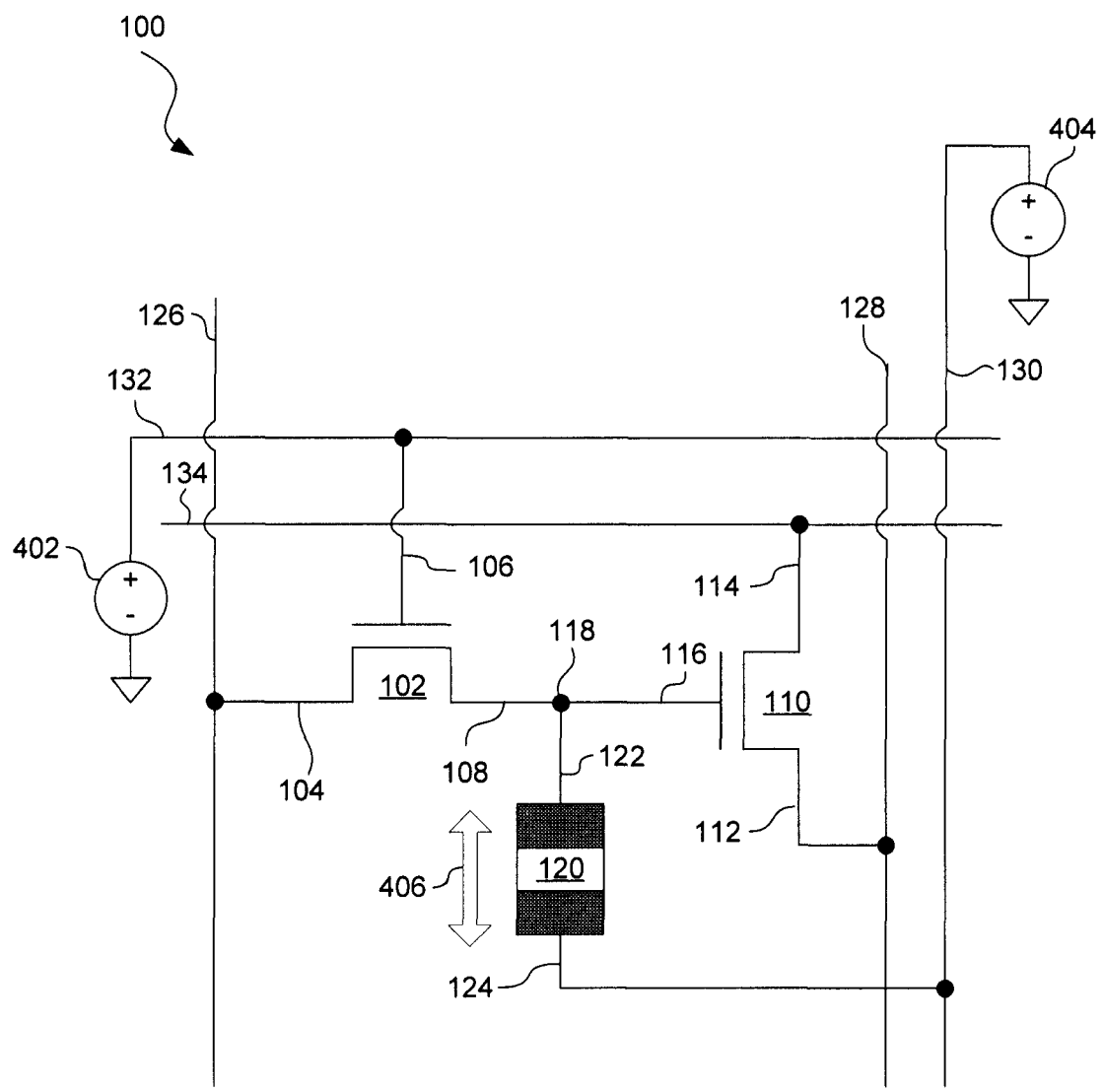
FIG. 4 is a diagram showing an illustrative read/write operation for a hybrid memory cell in a non-volatile mode, according to one example of principles described herein.

FIG. 4 is a diagram showing an illustrative read/write operation for a hybrid memory cell 100 in a non-volatile mode. Through the read and write operations described above, the hybrid memory cell 100 can act as a volatile dynamic memory cell. It will thus have faster read and write times. Nevertheless, it will consume a relatively high amount of power. It can be beneficial for the hybrid memory cell 100 to switch to a low power, non-volatile state.

According to certain illustrative examples, the hybrid memory cell 100 can be set to store data through the resistive state of the resistive switching device 110. This mode is referred to as the non-volatile mode. Because the resistive state of the resistive switching device 120 will maintain its state with or without a power source, the data stored in the resistive switching device 120 is non-volatile. In addition, the memory cell 100 in a non-volatile mode will consume less power.

To write the state of the memory cell 100 in a non-volatile mode, a write signal 402 may be applied to the word write line 132. Additionally, in some examples, a signal 404 may be applied to the select line 130 connected to the second terminal 124 of the resistive switching device. The combination of these signals 402, 404 can create the voltage conditions that will switch the state of the device. For example, a voltage of sufficient strength may be applied to set the resistive switching device 120 to a high resistive state. To switch the resistive switching device 120 to a low resistive state, an oppositely polarized voltage of sufficient strength may be applied across the device 120.

There are various methods that may be used to read the resistive state of the resistive switching device 120. For example, to read the state of the hybrid memory cell 100 in the non-volatile mode, a sense amplifier may be connected to the select line 130. Additionally, a read signal may be applied across the resistive switching device 120. Based on the state of the resistive switching device, the current levels detected by the sense amplifier will vary. The memory system may thus know whether the resistive switching device is storing a logical '1' or a logical '0'.

A device having a hybrid memory system as described above may switch between the two modes for a variety of reasons. Specifically, various memory and power requirements may determine when to switch between the two different modes. Particularly, an operating system of a device using a hybrid memory system may monitor power and memory conditions. In response to predetermined conditions, the operating system may cause the hybrid memory system to switch modes.

In one example, a device utilizing such a memory system may use the memory in dynamic mode while the device is currently being operated by a user. In this mode, the memory will operate faster, though it will consume more power. When the device is not currently being used, the memory can switch to the non-volatile mode. In this mode, the memory system may still be used to store important data. This can be done while saving power because the non-volatile memory does not need a power supply to maintain the data. Such memory systems conserve space on the integrated circuit chips because two types of memory systems occupy the same space.

Figure 5:
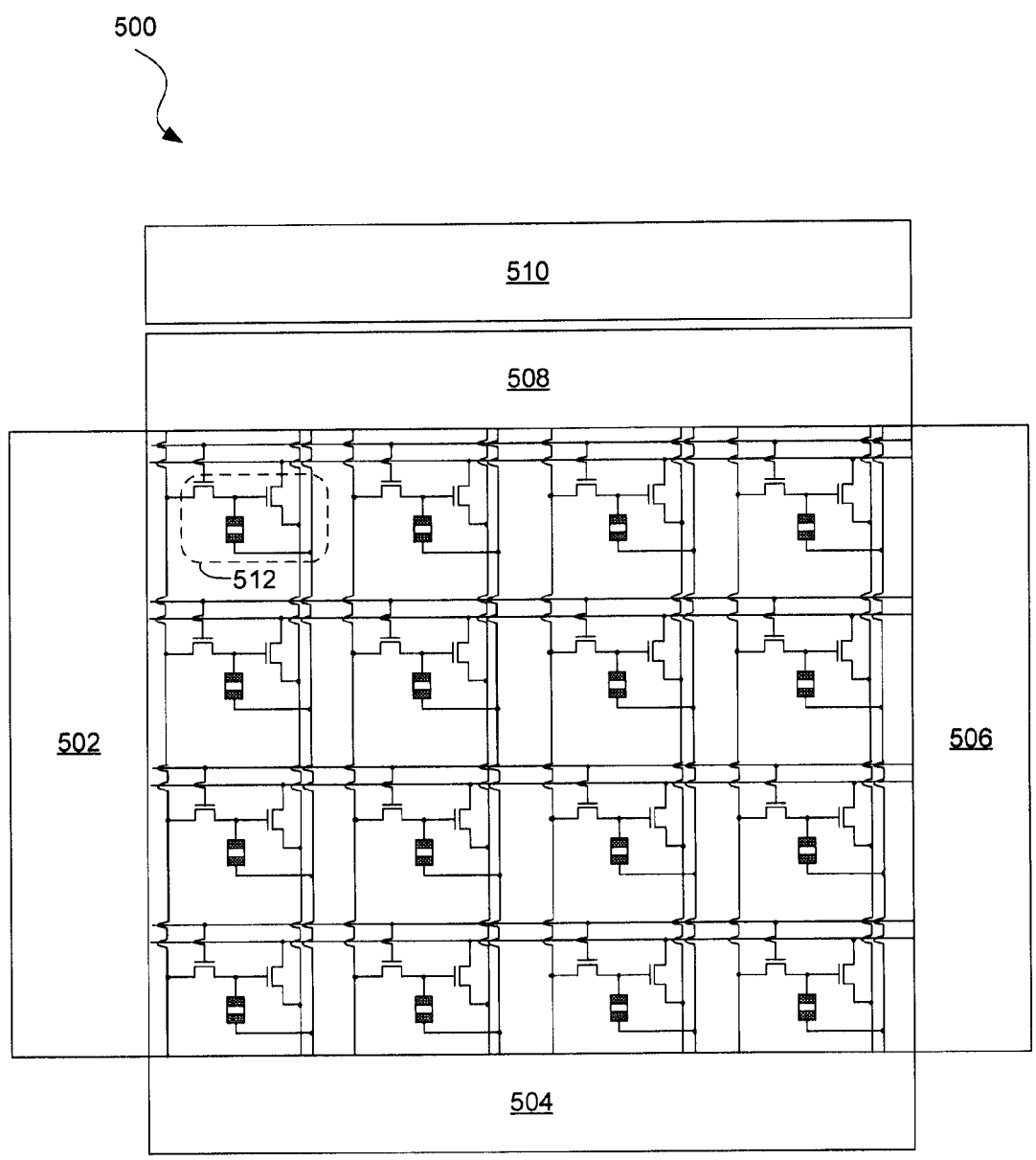
FIG. 5 is a diagram showing an illustrative memory array of hybrid memory cells, according to one example of principles described herein.

FIG. 5 is a diagram of a device having a memory array 500 of hybrid memory cells. As mentioned above, the memory cell described above may be part of a memory array. While FIG. 5 illustrates a 4×4 memory array 500 with only 16 memory cells 512, it is understood that a practical array may have a much larger number of memory cells. Also, it is understood that the device may be a processor, logic device, or some other device with embedded memory, or may be a standalone memory device.

According to certain illustrative examples, the control circuitry 502 for the write word lines may be placed on one side of the array 500. This circuitry 502 includes the various components that select and apply signals to specific word lines within the array 500. Additionally, control circuitry 506 for the read word lines may be placed on the opposite side of the array from the write word line control circuitry 502. The read word line control circuitry 506 includes the various components that select and apply signals to specific read word lines within the array 500.

According to certain illustrative examples, control circuitry 504 for the write bit lines may be placed on one side of the array. The write bit line circuitry 504 includes the various components that select and apply certain signals to specific write bit lines within the array. Additionally, the control circuitry 510 for the read bit lines and the select lines may be placed on the opposite side of the array 500 from the write bit lines control circuitry 504. The read bit lines and select lines control circuitry 510 includes the various components that select and apply signals to various read bit lines and select lines.

According to certain illustrative examples, the control circuitry 508 for the sense amplifiers as well as the sense amplifiers themselves may be placed between the array 500 and the control circuitry 510 for the read bits lines and select lines. The control circuitry 508 for the sense amplifiers can operate in accordance with the control circuitry 510 for the read bit lines so that certain read bit lines can be connected to specific sense amplifiers at specific times. The sense amplifiers can be used to read the state of a memory cell 512 within the memory array 500 in either the dynamic mode or the non-volatile mode.

Figure 6:
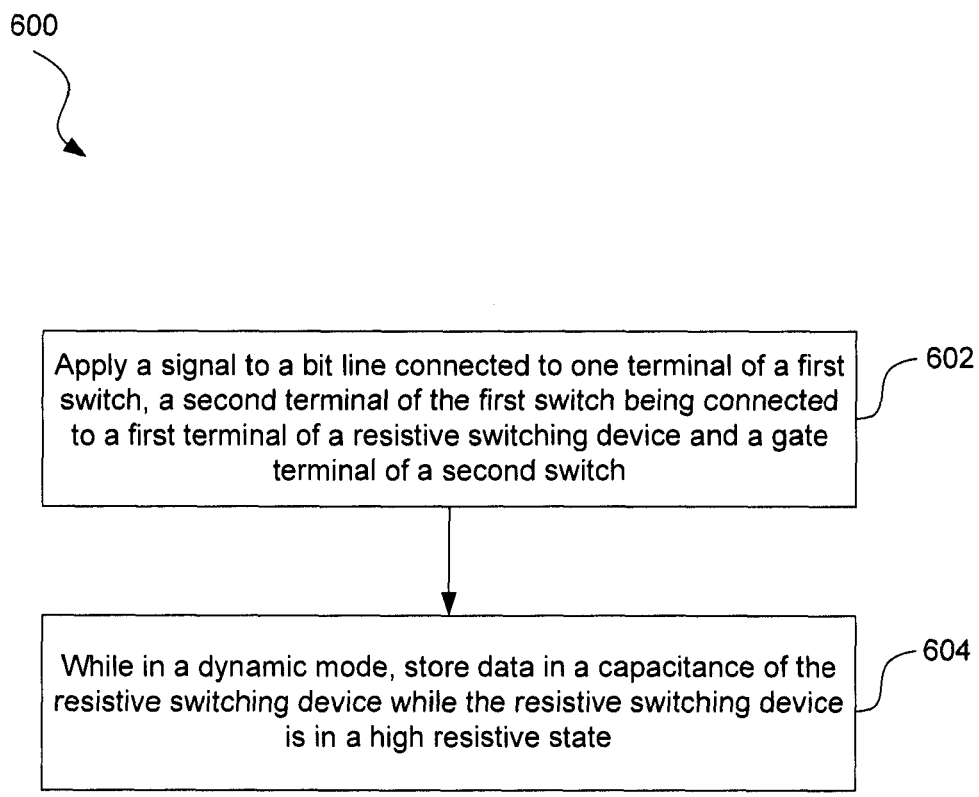
FIG. 6 is a flowchart showing an illustrative method for operating a hybrid memory system, according to one example of principles described herein.

FIG. 6 is a flowchart showing an illustrative method 600 for operating a hybrid memory system. According to certain illustrative examples, the method 600 includes the step 602 of applying a signal to a bit line connected to one terminal of a first switch, a second terminal of the first switch being connected to a first terminal of a resistive switching device and a gate terminal of a second switch. The method 600 also includes the step 604 of, while in a dynamic mode, storing data in a capacitance of the resistive switching device while the resistive switching device is in a high resistive state.

According to certain illustrative examples, a two-switch hybrid memory cell device includes a storage node connected between one terminal of a first switch and a gate of a second switch. The device also includes a resistive switching device connected to the storage node. The resistive switching device is to act as a capacitance by being set to a high resistive state when the memory cell is in a dynamic mode.

According to certain illustrative examples, a method for operating a two-switch hybrid memory system includes applying a signal to a bit line connected to one terminal of a first switch, a second terminal of the first switch being connected to a first terminal of a resistive switching device and a gate terminal of a second switch. The method also includes, while in a dynamic mode, storing data in a capacitance of the resistive switching device while the resistive switching device is in a high resistive state.

According to certain illustrative examples, a hybrid memory system includes a number of two-switch cells. Each cell includes a write switch having a first terminal connected to a write bit line, a second terminal connected to a storage node, and a gate connected to a write word line. Each cell further includes a read switch having a gate connected to the storage node, a first terminal connected to a read word line, and a second terminal connected to a read bit line. Each cell further includes a resistive switching device comprising, a first terminal connected to the storage node and a second terminal connected to a select line. A capacitance of the resistive switching device while in a high resistive state is to store data while the memory cell is in a dynamic mode and a resistive state of the resistive switching device is used to store data while the memory cell is in a non-volatile mode.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A two-switch hybrid memory cell device comprising:
   a storage node connected between one terminal of a first switch and a gate of a second switch, the first switch also being connected to a write bit line, and the second switch being connected to a read bit line; and
   a resistive switching device connected between the storage node and a select line, the select line not in direct connection with the second switch;
   wherein the resistive switching device is to act as a capacitance by being set to a high resistive state when the memory cell is in a dynamic mode.

2. The device of claim 1, wherein the capacitance of the resistive switching device is to store a digital value while the memory cell is in a dynamic mode.

3. The device of claim 1, wherein a memory system utilizing the memory cell is to refresh the capacitance of the resistive switching device periodically.

4. The device of claim 1, wherein the resistive switching device is to store data in a non-volatile manner while the memory cell is in a non-volatile mode.

5. The device of claim 1, wherein the resistive switching device is a metal-insulator-metal transition device.

6. The device of claim 1, wherein the memory cell is part of an embedded memory system.

7. The device of claim 1, wherein a memory system utilizing the memory cell switches between the dynamic mode and a non-volatile mode in response to a combination of power and memory requirements.

8. A method for operating a two-switch hybrid memory cell, the method comprising:
   applying a signal to a bit line connected to one terminal of a first switch, a second terminal of the first switch being connected to a first terminal of a resistive switching device and a gate terminal of a second switch; and while in a dynamic mode, storing data in a capacitance of the resistive switching device while the resistive switching device is in a high resistive state; and while in a non-volatile mode, storing data with a resistive state of the resistive switching device.

9. The method of claim 8, further comprising:

applying a read signal to a word line connected to a first terminal of the second switch; and connecting a sense amplifier to a bit line connected to a second terminal of the second switch to read a state of the capacitance used to store data.

10. The method of claim 8, further comprising periodically refreshing a signal stored in the capacitance of the resistive switching device.

11. The method of claim 8, further comprising, changing the memory cell to the non-volatile mode.

12. The method of claim 11, wherein changing the memory cell between the non-volatile mode and the dynamic mode is done in response to demands from a system utilizing the memory cell, the demands being based on a combination of memory and power requirements.

13. The method of claim 11, wherein the resistive switching device is connected to a select line that is not directly connected to the second switch, the method further comprising:

detecting the state of the resistive switching device by connecting the select line to a sense amplifier.

14. The method of claim 13, further comprising, changing the resistive state of the resistive switching device by applying a signal between the bit line connected to the first terminal of the first switch and the select line.

15. The method of claim 8, wherein the resistive switching device is a metal-insulator-metal transition device.

16. The method of claim 8, wherein the memory cell is part of an embedded memory system.

17. A hybrid memory system comprising a number of two-switch cells, each cell comprising:

a write switch comprising:
a first terminal connected to a write bit line;
a second terminal connected to a storage node; and
a gate connected to a write word line; and a read switch comprising:
a gate connected to the storage node;
a first terminal connected to a read word line; and
a second terminal connected to a read bit line; and a resistive switching device comprising:
a first terminal connected to the storage node; and
a second terminal connected to a select line;

wherein a capacitance of the resistive switching device while in a high resistive state is to store data while the memory cell is in a dynamic mode and a resistive state of the resistive switching device is used to store data while the memory cell is in a non-volatile mode.

18. The system of claim 17, wherein the resistive switching device is a metal-insulator-metal transition device.

19. The system of claim 17, wherein the memory system comprises an embedded memory system.

20. The system of claim 17, wherein the memory system is to switch between the dynamic mode and the non-volatile mode in response to a combination of power and memory requirements.

* * * * *